United States Patent [19]
Flynn et al.

[11] Patent Number: 4,644,484
[45] Date of Patent: Feb. 17, 1987

[54] STAND-ALONE ACCESS CONTROL SYSTEM CLOCK CONTROL

[75] Inventors: Kevin Flynn, Brighton; Eric V. Schultz, Cambridge, both of Mass.

[73] Assignee: American District Telegraph Company, New York, N.Y.

[21] Appl. No.: 612,687

[22] Filed: May 22, 1984

[51] Int. Cl.⁴ ........................ G04F 10/50; H03K 1/17; G08B 1/00; G04B 17/12

[52] U.S. Cl. ................................ 364/569; 340/825.31; 340/309.15; 328/63; 368/200; 377/16

[58] Field of Search ........................ 364/569; 235/377; 377/84, 16; 328/61, 63, 155; 368/200–202; 340/825.31, 306, 309.15; 331/1 A

[56] References Cited

U.S. PATENT DOCUMENTS

| | | | |
|---|---|---|---|
| 4,254,494 | 3/1981 | Maeda | 368/200 X |
| 4,308,607 | 12/1981 | Sekiya et al. | 368/202 X |
| 4,408,897 | 10/1983 | Mutrux | 368/202 X |
| 4,427,302 | 1/1984 | Watanabe | 368/202 X |
| 4,453,834 | 6/1984 | Suzuki et al. | 368/201 |
| 4,502,790 | 3/1985 | Yokoyama | 368/200 |
| 4,531,826 | 7/1985 | Stoughton et al. | 377/16 X |
| 4,537,515 | 8/1985 | Dinger et al. | 368/202 |
| 4,538,056 | 8/1985 | Young et al. | 340/825.31 X |
| 4,564,953 | 1/1986 | Werking | 328/63 X |

OTHER PUBLICATIONS

Karstad et al., "A Software-Controlled Real-Time Clock", *New Electronics*, vol. 12, No. 12, Jan. 12, 1979, pp. 26–32.

*Primary Examiner*—Errol A. Krass
*Assistant Examiner*—Joseph L. Dixon
*Attorney, Agent, or Firm*—Weingarten, Schurgin, Gagnebin & Hayes

[57] ABSTRACT

A card reader located in proximity to the central point of the secured area having a crystal controlled time base clock. Entry is granted when the proper information is entered to the card reader through a keypad or identification card. The clock is adjusted under software control according to a selected offset signal. The card reader is operable to provide access control of a secured area according to a schedule operable relative to the card reader clock without external reference signals.

6 Claims, 2 Drawing Figures

STAND-ALONE ACCESS CONTROL SYSTEM CLOCK CONTROL

FIELD OF THE INVENTION

The present invention relates to security systems, and in particular to access control security systems having a software controlled time base clock.

BACKGROUND OF THE INVENTION

Security systems are employed to provide a restricted or controlled entry to a particular place or security area. Detailed information concerning the identity of the user and the associated passcodes are keyed to time schedules during which the user will be permitted access to the controlled area. The schedules include day, hour, and minute data. Typically the data, if sufficiently large, will be stored in a centralized location which also synchronizes the card reader clocks, if used. However, for many facilities, such centralized control for access control systems is undesirable or unfeasible. Under such conditions, the access control systems and card reader must be self-contained and maintain long-term reliability and accuracy.

Time data including day, hour, and minute information is frequently generated by a separate integrated circuit, typically an MM58174 by National Semiconductor Corporation of Santa Clara, Calif. If the crystal is not precisely adjusted, typically by an adjustable trimmer capacitor, time errors will accumulate, which can only be corrected by loading a corrected time into the circuit. Such adjustment or correction requires additional test equipment or digital logic which makes field adjustment difficult or impossible.

SUMMARY OF THE INVENTION

The security system according to the present invention provides complete access control to a security area according to time-related schedules specifiable to particular hours and minutes for seven days and a holiday program. The access to the user is obtained by keycode entry, card only, or a combination of card and keycode entry.

The schedule times are referenced to an access control system clock which provides reliable and accurate time indication. The clock includes a crystal oscillator and associated logic, contained within a microprocessor, to permit accurate control of the clock by a programmable offset number.

The programmable offset number is easily selected by system installers by operation of a multiple section switch located in the access system. As a result, the system time is easily and accurately adjusted without unnecessary hardware or difficulty.

BRIEF DESCRIPTION OF THE DRAWING

These and further features of the present invention will be further understood by reading the following detailed description, taken together with the following drawing, wherein.

DETAILED DESCRIPTION OF THE INVENTION

Figure 1:
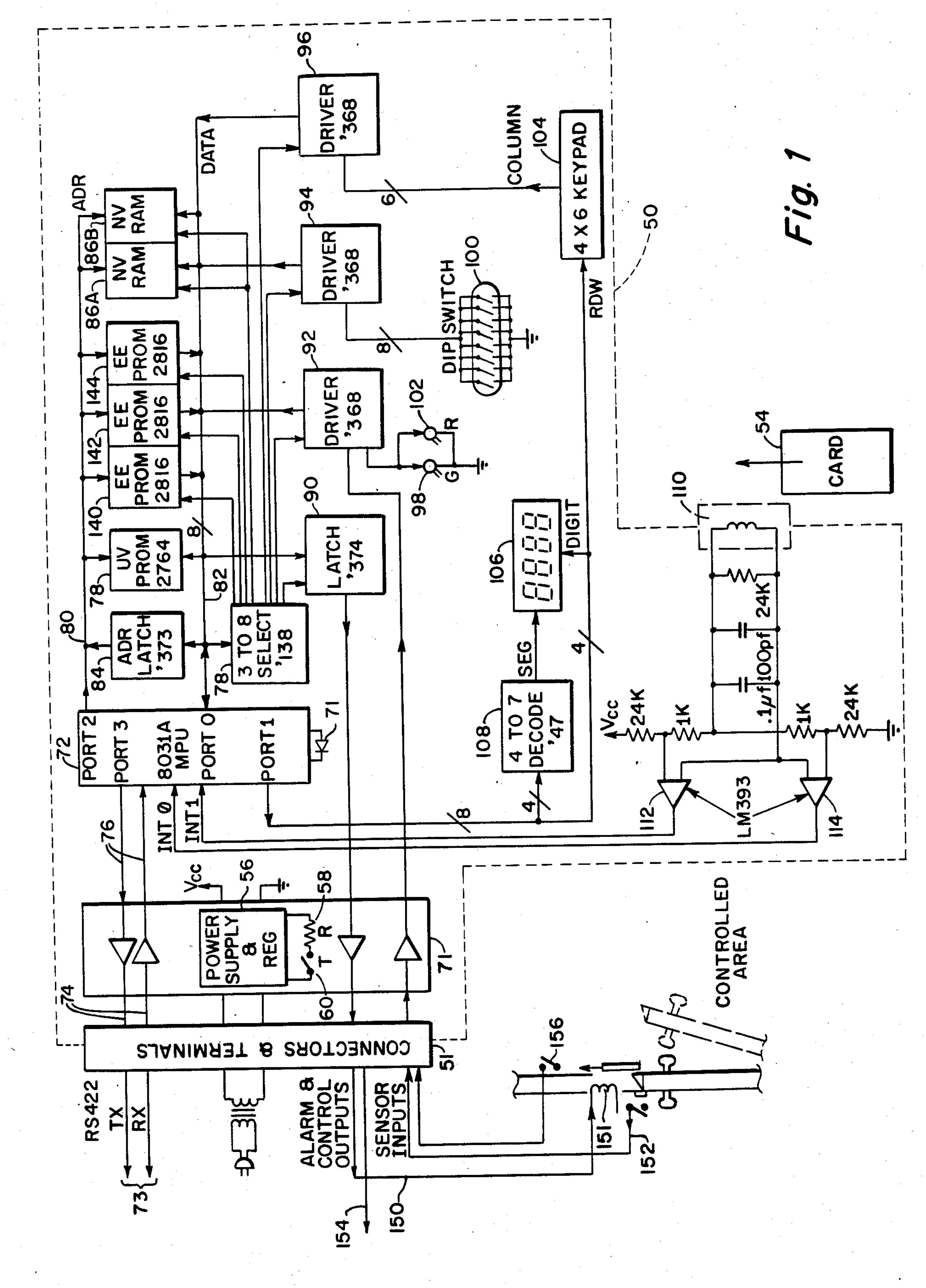
FIG. 1 is a partial schematic diagram of the security system according to the present invention.

There are three operating modes for the reader: (1) normal operating mode, (2) programming mode, and (3) degraded mode. In the normal operating mode, the reader admits any card, keycode, or card and keycode user if they are within their assigned access times. The programming mode may be accessed from normal operating mode, or degraded mode by presenting a programming mode card.

In normal operation, that is, in nonprogramming mode, keys 0–9 and "clear" are operable. The keypad 52 is used solely for the user to enter his passcode when required.

To enter programming mode, the system "manager" merely runs a special "programming mode card" 54 through the reader sensor 110. In addition, the card may require entry of a keycode. The entire 24-key key pad becomes active, allowing full programming capability as described below. The programming mode card is any card with the proper site code, which is in the reader's database, and which has a programming mode attribute set.

Each reader 50 may have up to eight schedules (an On and Off time) for each of eight days (Monday-Sunday and a holiday programmable by the system manager). All users may be individually programmed to have an access during any or all of the programmed schedules. Schedules are permanent until redefined; there are not temporary schedules. Schedules may apply to all three types of users; keycode-only, card-only, or card and keycode. If a key is not pressed within 45 seconds, then programming mode is timed out, and the reader resumes normal operation.

While the reader is in programming mode, the system manager may display and/or change any system parameter (duress digit, time, day, etc.) or contents of the database (schedules, user's permitted schedules, etc.), void or validate any card or keycode, or optionally print desired information from the database.

The number of cards, programming and user, 217, may be increased through two expansion options of 292 and 293 each, to a maximum of 802 cards.

An additional, optional feature includes antipassback, wherein a user is prevented from entering more than once without having exited, or from exiting without having first entered. The antipassback system configuration requires two readers, one on each side of a portal, and has simple communication between the pair of readers on leads 73 which announces the entry/exit of users to the other reader (not shown), with each reader keeping a data record of whether each user is "in" or "out" by setting or clearing corresponding antipassback bits. The system output drives up to 2,640 feet of twisted pair that may be extended with RS-422 compatible devices (e.g., RF, AC line). The antipassback data is stored in nonvolatile RAM (NVRAM) to guard against loss when power fails. The clocks in both readers are adjusted to provide the same time indication.

As there is not battery backup, in case of reader restart (e.g., after powerfail or reconnection), the reader will assume degraded mode. Using a simple programming sequence, the reader may be set to allow or disallow degraded mode access. While the reader is in this mode, the display will flash the time, and will not resume normal operation until the clock time and day is set (in programming mode).

Green light-emitting diodes (LEDs) indicate a Go condition for any valid access; No-go (red) indicates bad card, or bad keycode, or a key pressed while the keyboard is disabled.

To gain access (during both normal operations and degraded mode), the following steps are necessary. If a card is not required to gain access, skip step (1):

(1) The user presents his access card to the reader. If the card is permitted to access the reader at this time, the green "Go" LED will light and the strike will operate if a keycode is not required. If the reader is in degraded mode, the reader must be set to allow degraded mode access, or the user must use the duress digit when entering his keycode with the reader signalling a duress alarm, in order to gain entry.

(2) If a code is required, it may now be keyed in. The reader will prompt a card-and-keycode user for his keycode, when required, by clearing the display. If the user fails to initiate keycode entry within 15 seconds, or once he has initiated keycode entry, if he fails to enter a key within 30 seconds of the previous key, the reader will timeout and display the clock. If an error is made while typing in the keycode, the user may enter the Clear key which will abort the current attempt and increment the keyboard error count. The user may then reenter the code until the proper code has been entered, or until the keyboard error limit has been exceeded. If the keyboard error limit is enabled (settable 1-10) and exceeded the keyboard is disabled for one minute, and the alarm output is activated. If a key is pressed while the keyboard is disabled, the red LED will light for a brief moment.

According to the present invention, the remote card reader 50 is shown in FIG. 1, which also includes a power supply (56) and line driver board 71. The board 71 also includes a resistor 58 and temperature-sensitive switch 60 which are operable to maintain a constant temperature in a housing (not shown) for the reader 50. System connectors and miscellaneous components reside on mounting card 51 to facilitate connection to the external devices. Card reader circuit diagram 50 includes an MPU 72, which can communicate with external equipment (not shown) and the buffer card 71 on leads 74 and 76, respectively. The MPU 72, Part No. 8031 by Intel Corporation of Sunnyvale, Calif., processes the signal according to a program stored on the ROM 78, typically Part. No. 2764. The MPU 72 port 2 provides address signals on leads 80, and additional address signals from the 8-bit databus 82, captured by the address latch 84, typically Part No. 74LS373. In addition, transient information is stored in the non-volatile random access memory (NVRAM) 86A and 86B, connected in parallel, also receiving the address signals on leads 80 and data signals on leads 82. The NVRAM 86A and 86B are enabled by a signal provided by the 3-to-8 decoder 88, typically Part No. 74LS138. The MPU 72 communicates to additional or external circuits through latch 90, typically Part. No. 74LS374, and drivers 92, 94, and 96, typically Parts No. 74LS368. The latch 90 provides alarm and control output signals to the external environment, and the driver 92 receives sensor inputs from the external environment through the card 51, including known connector and driver elements. Moreover, the driver 94 provides signals to indicator light emitting diodes (LEDs) 98 and 102, whose function is discussed below. An eight position dual-in-line package switch 100, retained on board 51 is read by driver 94, for functions described below. External card user signals are received by the system MPU 72 through the driver 96 from a matrix keypad 104 wherein a sequence of four row signals is provided from the MPU 72 port 1, the corresponding orthogonal sense lines being received by the driver 96 and read therein upon select signal provided by select decoder 88 according to techniques known in the art. Similarly, the drivers 92 and 94, as well as latch 90 are enabled by select signals provided by the decoder 88 according to signals generated by the MPU 72 and received over the address bus 82. In addition, a four-digit seven-segment display 106 is provided wherein the segments are driven by a four-to-seven segment decoder 108 being driven from the MPU 72 port 1; similarly, the digits are selected by the remaining four bits of port 1 signals.

The card reader further includes a card reader coil 110 producing a pulse signal upon presentation of the card 54 as taught by the manufacturer Sensor Engineering of Hamden, Connecticut, the manufacturer's information being incorporated by reference. The signal produced by the coil 110 is received by a pair of comparators 112 and 114 to detect negative and positive transitions thereof.

The pulse signals provided by the comparators 112 and 114 are received by the MPU 72. As the card 54 passes before the reader head 110, a sequence of pulses is received by the interrupt ports, causing the MPU 72 to suspend normal operations and begin a program to decode the card signals encoded thereon.

Each reader comes equipped with three programming cards, preset in the database. If the user requires new cards, they must be ordered and installed by the manufacturer.

There is no battery backup for the card reader 50. However, the card reader circuit 50 includes the electrically erasable programmable read only memories (EEPROM) 140, 142, and 144, typically comprising Part No. 2816 by Xicor of Milpitas, Calif., and additional backup non-volatile RAM (NVRAM) 86A and 86B, typically Part No. 2212, also made by Xicor. The EEPROMS 140-144 are enabled by the corresponding decoded signals from the select decoder 88, and the NVRAM 86A is connected in parallel with the NVRAM 86B, both receiving the identical address data and chip select signals. The EEPROMS 140-144 are used to store the long term infrequently changed information such as schedules, whereas the NVRAMs 86A and 86B are used to retain the more frequently changed information.

The DIP switch 100 is used to compensate for crystal variations. The switch may either increase or decrease the clock's speed by 31 parts in 200. The first seven switches are used to form the magnitude according to a power of 2; the remaining switch is the sign bit. The clock operates as follows: The clock is derived from the crystal 71 associated with the processor 72, shown in FIG. 4. The crystal signal is divided by a counter which is reset with a predetermined count value, 200 times a second. For 199 times, the counter is reset to a predetermined value. However, on the 200th time, the counter is preset to the predetermined value, offset by the value indicated by the DIP switch 100, which provides a value corresponding to a change of $\pm 31$ counts. After the 200th count, the downcounter is reloaded by the normal predetermined value.

Figure 2:
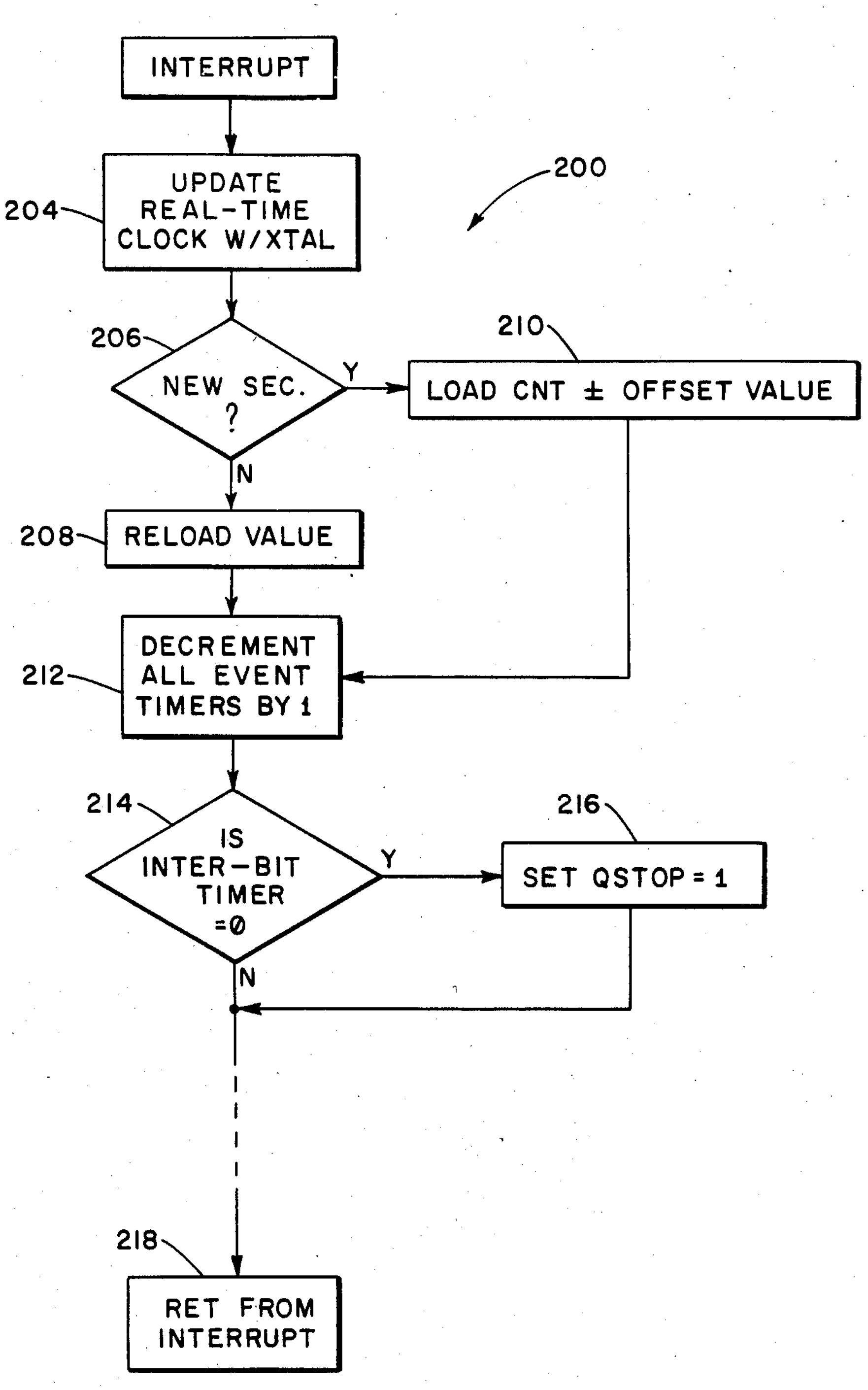
FIG. 2 is a flowchart showing software control of the system clock.

A flowchart 200 of the system dataflow providing for software adjustment of the time base clock (within MPU 72) is shown in FIG. 2. The clock is comprised of a counter (within MPU 72, a Part No. 8031) which is loaded with a number at approximately 5-millisecond intervals, 202, which interrupts the MPU 72. The 5-millisecond intervals occur after the counter counts from the loaded numeric value to zero, 204. If a new second is not generated 206, a constant value is loaded into the counter at 208. If a new second (one per 200 interrupts) is generated, the counter is loaded with the fixed value plus the offset value, typically $\pm 31$ counts per 5000, at 210. In either case, the eight system MPU event times 212, of which one is shown, 214, are decremented by one. The exemplary "interbit timer" measures the time which elapses between received bit signals (from comparator 112 or 114), and provides a "time out" indication if equal to 0, at 216. After servicing the remaining counters (not shown), the system returns from interrupt, 218.

All inputs are subject to a 50-millisecond software debouncing, hence momentary transitions (noise, etc.) will be ignored.

Relay contacts for lead 150 are provided for door strike 151 activation with 1 A, 24 VAC rating, and are active until programmable strike timer times out (1-10 seconds), or until Door Ajar Input 152 detects door opening, whichever occurs first.

The Alarm Shunt Output is normally off, SPDT relay contact for lead 154 with 1 A 24 VAC rating, and is programmable (0-30 seconds). The relay is activated just before the strike output. Output will resume the "off" state if the strike timer times out. The actual shunt timer does not begin until the reader senses door ajar.

The Door Ajar Input 152 is normally grounded and causes alarm if open longer than the programmable delay (1-30 seconds) time.

The Exit Switch Input 156 is normally open. On grounding, it activates the door strike, and may be connected to a toggle switch. When invoked, the reader will initiate a valid access timing sequence. If the exit pushbutton is grounded longer than the strike timeout value, the strike will be deactivated and the pushbutton will have to be pushed again to maintain the strike.

The Alarm Output at 154 is activated by door ajar timeout, keyboard error counter limit overflow, or other alarm conditions. A relay contact with 1 A, 24 VAC rating is provided, which opens on alarm.

The case where the user fails to open the door before the strike times out is exactly the same as the case wherein there are no door contacts. That taken care of, assume in the following, that the user actually opens the door before the strike times out. The door opening marks the end of one transaction, and is the point where the reader is accessed. If the door is opened longer than is allowed, the reader will signal a local alarm. In any event, the door ajar and shunt timers will stop when either the user closes the door, or when the timers time out, whichever comes first.

All parameters are stored in nonvolatile RAM (NVRAM) 86A and 86B, discussed above. NVRAM parameters may be changed from the keypad and viewed on the display, using the change command while the reader is in programming mode. Initial values given below are those pre-programmed at the factory. When set, users are allowed to enter during degraded mode; when clear, users are denied all but duress entries. Default mode is set. Strike time is programmable between 0-15 seconds, with an initial value of 3 seconds. Shunt time is programmable between 0-30 seconds with 2-second resolution and starts when strike time starts. An initial default value is 10 seconds. Door Ajar Delay is programmable between 0-30 seconds with 2-second resolution. The timeout starts when the user opens the door, signalled by door ajar input. The initial time is 10 seconds. Duress Digit 0-9 may be selected, or disabled. Keyboard Error Counter Maximum Count 1-10 may be selected or disabled. The initial default value is 3.

A 24-hour time display keeps track of day of week, but not date; holidays may be programmed up to and including six days in advance; holidays automatically revert to normal days at midnight at the end of the holiday.

Any card in the database may be assigned programming privileges. Programming mode privileges are not restricted to any schedules, are valid during degraded mode, and may require a keycode.

The special duress digit is programmable, or may be disabled entirely. Entering the duress digit with a valid passcode initiates the normal access timing procedure (strike, door ajar, and shunt timers) and activates the duress alarm output.

If the keyboard error counter option is enabled, the reader will count the number of bad keycodes typed in. If the number of sequential bad attempts exceeds the programmed number (1 to 10), the alarm output will be activated.

The present invention is not limited to the above-described embodiment. Additional embodiments, variations, and configurations, which may be made through subsitutions of known parts by one skilled in the art, are within the scope of the present invention. Therefore, the present invention is not to be limited except according to the claims which follow.

What is claimed is:

1. For use in a programmable machine, a time base comprising:

a time base clock for producing a clock signal;

means for generating a count value;

a counter means for receiving said clock signal and said count value to count to a logic state , the count to said logic state being repeated for a predetermined sequence;

means for generating an offset signal; and means for producing a combined signal corresponding to said offset signal and said count value, wherein said combined signal is received by said counter means after said predetermined sequence, said predetermined sequence being restarted thereafter.

2. The time base of claim 1, wherein said time base clock includes a crystal element for generation of said clock signal.

3. The time base of claim 2, further including a processor means, wherein at least one of said means for generating a count value said counter means, said means for generating an offset signal, and said means for producing a combined signal is included in said processor.

4. The time base of claim 3, wherein said means for generating an offset signal comprises a switch connected to said processor which reads said switch to produce said offset signal.

5. The time base of claim 4, further including:

code entry means for producing a signal corresponding to a confidential entry code; and means for controlling access to a secured area according to an access control signal produced by said processor, wherein said processor receives said entry code signal and selectively provides said access control signal in response thereto.

6. The time base of claim 5, wherein said processor selectively provides said access control signal according to a schedule, wherein said schedule defines time periods when said access control signal is generated according to said logic state of said counter means.

* * * * *